(12) United States Patent
Javanifard et al.

(10) Patent No.: US 6,385,033 B1
(45) Date of Patent: May 7, 2002

(54) FINGERED CAPACITOR IN AN INTEGRATED CIRCUIT

(75) Inventors: Jahanshir J. Javanifard, Carmichael; Hari R. Giduturi, Folsom; Mathew B. Nazareth, El Dorado Hills, all of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/675,540

(22) Filed: Sep. 29, 2000

(51) Int. Cl.[7] ............................................... H01G 4/228
(52) U.S. Cl. ................... 361/306.2; 361/328; 361/329; 257/528; 257/532
(58) Field of Search ..................... 361/306.2, 306.3, 361/311–313, 301.4, 303, 329, 328; 257/306, 303, 528, 534, 532

(56) References Cited

U.S. PATENT DOCUMENTS

| | | | | |
|---|---|---|---|---|
| 5,583,359 A | * | 12/1996 | Ng et al. ..................... | 257/306 |
| 5,939,766 A | * | 8/1999 | Stolmeijer et al. .......... | 257/534 |
| 5,982,018 A | * | 11/1999 | Wark et al. .................. | 257/532 |
| 6,165,814 A | * | 12/2000 | Wark et al. .................. | 438/108 |

* cited by examiner

*Primary Examiner*—Anthony Dinkins
(74) *Attorney, Agent, or Firm*—Blakely, Sokoloff, Taylor & Zafman LLP

(57) ABSTRACT

A fingered capacitor in an integrated circuit. A first capacitor element is formed in a first layer of an integrated circuit (IC) die. The first capacitor element includes a positive plate and a negative plate. Each of the positive and negative plates of the first capacitor element has a plurality of fingers interdigitated with the fingers of the other of the positive and negative plates of the first capacitor element. The fingers are separated by a dielectric. The interdigitated fingers cooperate to generate fringe capacitance between neighboring fingers. A plurality of capacitor elements having interdigitated fingers can be provided in adjacent layers of the IC die.

21 Claims, 8 Drawing Sheets

FINGERED CAPACITOR IN AN INTEGRATED CIRCUIT

FIELD OF THE INVENTION

The present invention generally relates to integrated circuits and, more particularly, to a capacitor in an integrated circuit.

BACKGROUND

Integrated circuits typically include many devices formed in the various layers of an integrated circuit die. Typically, electronic devices are formed using many MOS transistors.

A capacitor in an integrated circuit can be formed using parallel plates that are formed between layers of the die. These layers are typically referred to as poly 1, metal 1, metal 2, etc. Parallel plate capacitors in integrated circuits require a relatively large amount of area or "real estate."

Another way to form a capacitor in an integrated circuit is to use MOS transistors. In the case of a MOS transistor, the capacitance value is a function of the applied voltage between the gate and the bulk of the die. Present deep sub-micron MOS transistors, however, are built with ultra-thin gate oxides. These types of transistors "leak" substantially, i.e. they do not retain a charge. Gate leakage occurs when the dielectric forming the gate oxide is not a perfect insulator and the current travels through the gate oxide.

The capacitance of a MOS capacitor is highly dependent on the applied voltage and its frequency, the threshold voltage of the MOSFET, and the temperature. At low voltages it is difficult to use a MOSFET as a capacitor if the threshold voltage and applied voltage are comparable. Building matching capacitors is extremely difficult to do in a process with ultra-thin gate oxide because minor variations in oxide thickness and applied voltages can make the two capacitances differ significantly. The leakage current through the gate oxide can only make the problem worse.

BRIEF DESCRIPTION OF THE DRAWINGS

The present invention is illustrated by way of example, and not limitation, in the figures of the accompanying drawings in which.

DETAILED DESCRIPTION

Embodiments of a fingered capacitor for an integrated circuit are described herein. The capacitor includes a first capacitor element in a first layer of an integrated circuit (IC) die. The first capacitor elements include a positive plate and a negative plate. Each of the positive and negatives plates have a plurality of fingers. The fingers of each plate are interdigitated with the fingers of the other plate. The fingers are separated by a dielectric. The interdigitated fingers of the positive and negative plates cooperate to generate fringe capacitance between neighboring fingers.

The lateral side-to-side fringe capacitance between the neighboring fingers can generate a relatively large capacitance in a small area. The basic structure of the first capacitor element can be formed in a first layer of an IC die. Additional capacitor elements including positive plates and negative plates having interdigitated fingers can be formed on additional layers of the die. The additional capacitor elements are preferably stacked vertically with respect to each other or the first capacitor element. The respective positive and negative plates of the stacked capacitor elements can be shorted. In addition to the fringe or side-to-side fringe capacitance generated within each capacitor element, vertical interlayer capacitance can be generated between the respective portions of positive and negative plates of the capacitor elements.

In general, semiconductor processes include multilayer interconnects, the simplest including one layer commonly referred to as poly 1 and another layer commonly referred to as metal 1. More complex processes include more than one metal interconnect layer.

Figure 1:
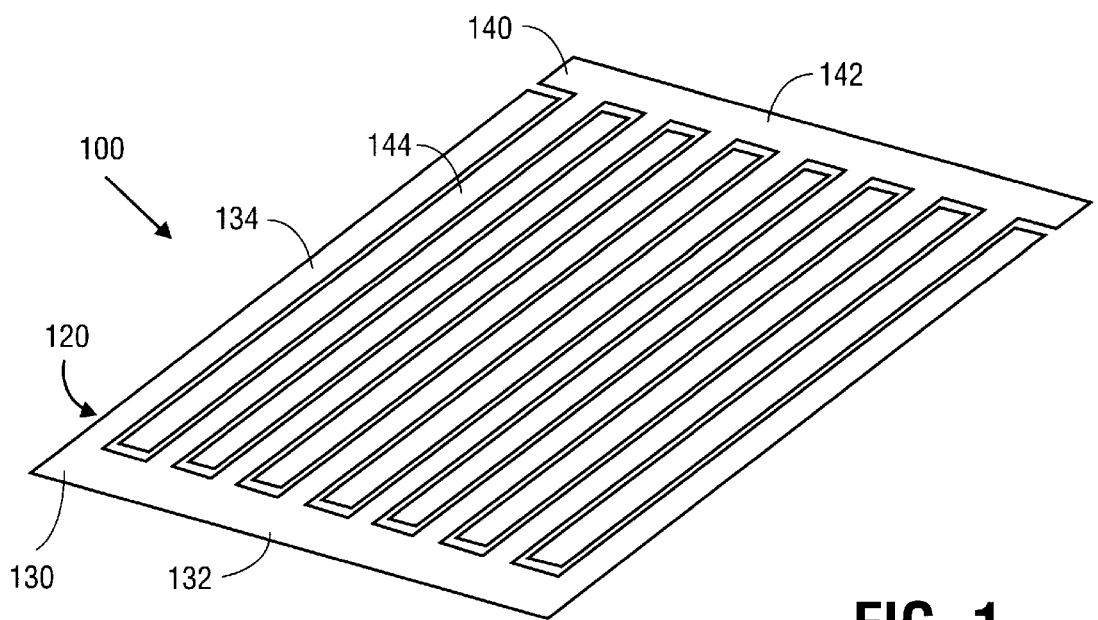
FIG. 1 is a perspective view of a capacitor element.

FIG. 1 shows a capacitor 100 including a first capacitor element 120. First capacitor element 120 includes a positive plate 130 and a negative plate 140. Positive plate 130 has a comb-like structure that includes an elongated end portion 132 having positive plate fingers 134 extending from the end portion 132. Fingers 134 are preferably evenly spaced and have consistent widths and lengths. Negative plate 140 includes an elongated end portion 142 that has fingers 144 extending therefrom.

In the embodiment of the first capacitor element 120 shown in FIG. 1, fingers 134 and 144 extend perpendicular to their respective end portions 132 and 142. Fingers 134 and 144 are interdigitated within the same layer of the integrated circuit die (not shown). A dielectric such as silicon dioxide ($SiO_2$) fills the space between the respective fingers 134 and 144. Current deep sub-micron integrated circuit manufacturing processes or techniques allow the spacing between the fingers to be close enough such that fringe capacitance between the vertical edges of adjacent fingers within each layer is quite significant compared to previous processes. Capacitance has been found to increase as the spacing between the fingers decreases. The newest techniques of forming devices in integrated circuits allow smaller spacing between fingers to generate relatively large amounts of fringe capacitance.

Figure 2:
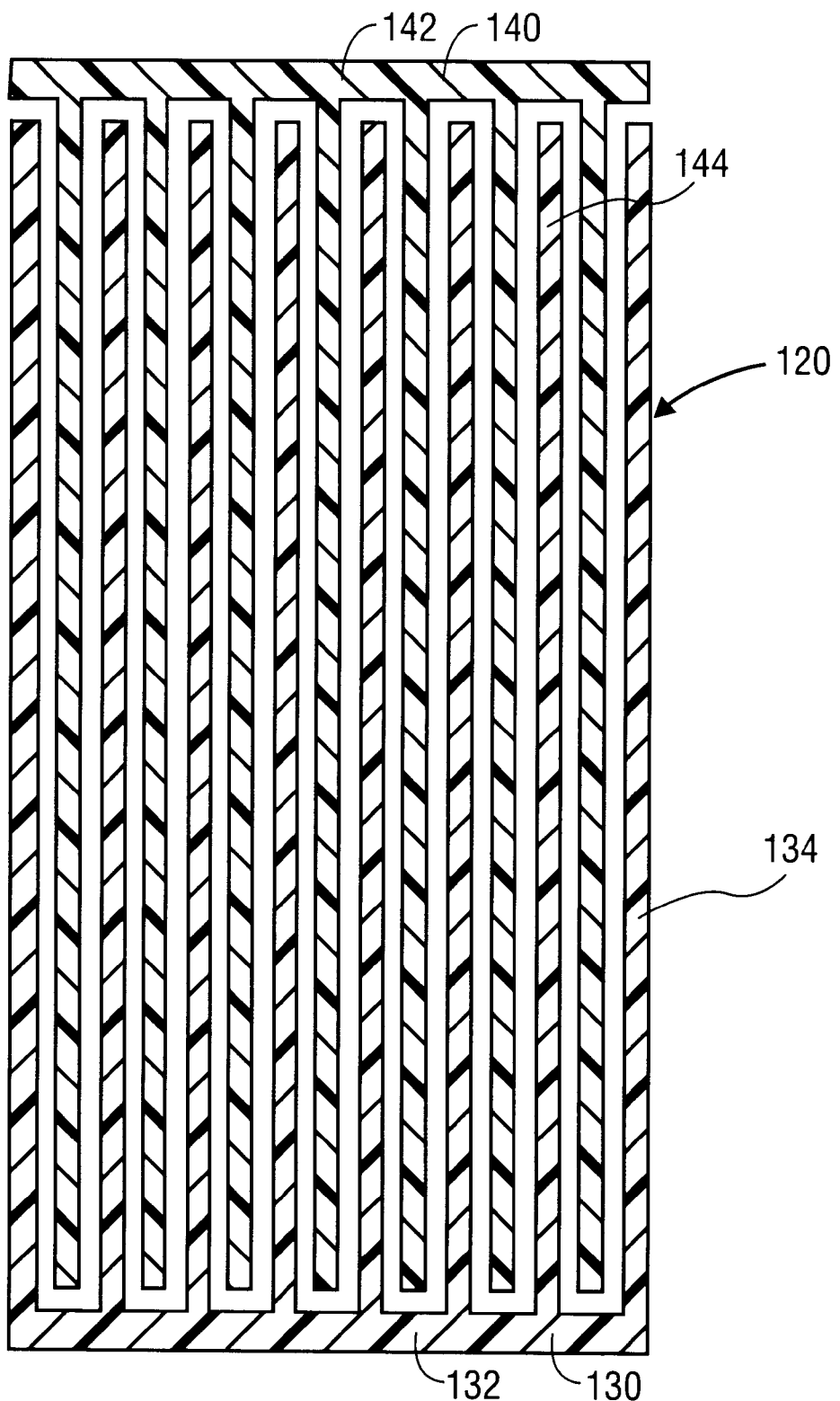
FIG. 2 is a plan view of a first capacitor element.

FIG. 2 is a top view of first capacitor element 120. End portion 132 of positive plate 130 is generally parallel to end portion 142 of negative plate 140. Fingers 134 and 144 extend between respective adjacent fingers of the oppositely charged plate and are thus interdigitated. The spacing between adjacent fingers of each of the positive and negative plates is generally consistent. The widths and lengths of the fingers of each plate are also generally consistent. It should be noted that the positive and negative designations for the plates of the capacitor elements described herein are for illustrative purposes only. Also, the number of fingers and the lengths and widths of the fingers and the spacing between the fingers can be selected as desired to achieve a particular capacitance value depending on various design parameters such as voltage requirements and different requirements of the particular circuit in which this capacitor is to be used. In general, the spacing between the neighboring fingers is effectively the smallest value allowed by the process that is used to get maximum capacitance in a small area.

Figure 3:
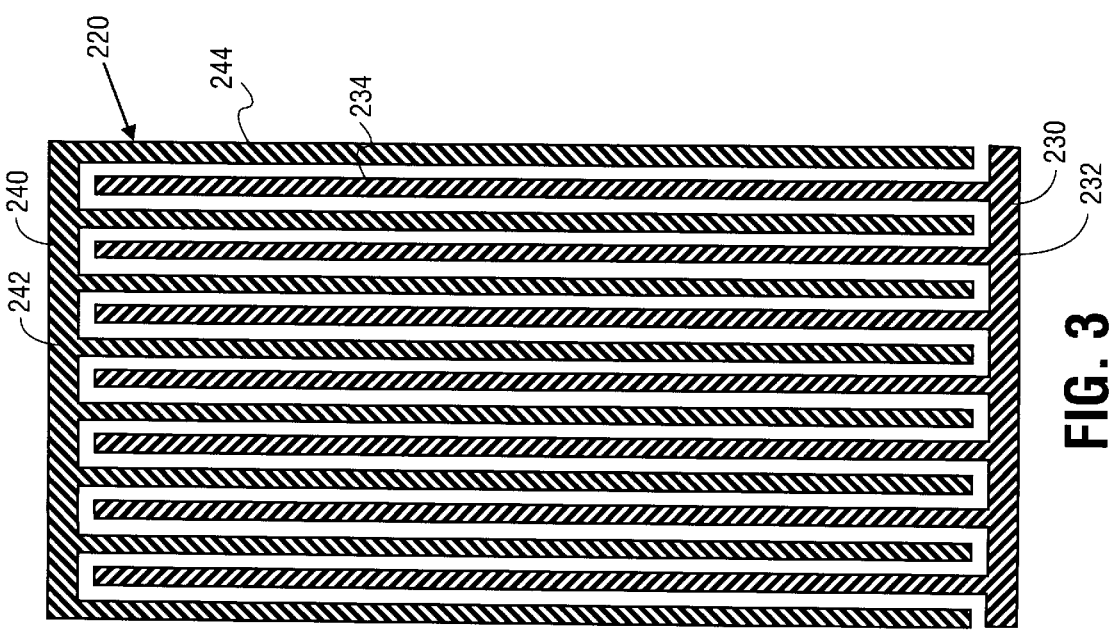
FIG. 3 is a plan view of a second capacitor element.

FIG. 3 shows a second capacitor element 220. Second capacitor element 220 includes positive plate 230 and negative plate 240. In an embodiment in which a capacitor is formed using stacked capacitor elements, the layouts of the positive and negatives plates of the second capacitor elements 220 are preferably reversed with respect to the plates of the first capacitor element 120 of FIG. 2, except that the orientation of the positive and negative plates is the same. The positive plate fingers 234 and the negative plate fingers 244 of the second capacitor element 220 extend from their respective end portions 232 and 242.

Second capacitor element 220 of FIG. 3 can be formed in a second layer of an integrated circuit die. The capacitor element 220 is preferably located directly above the first capacitor element 120, which is preferably formed in the IC die layer that is directly below the layer of the second capacitor element 220.

Figure 4:
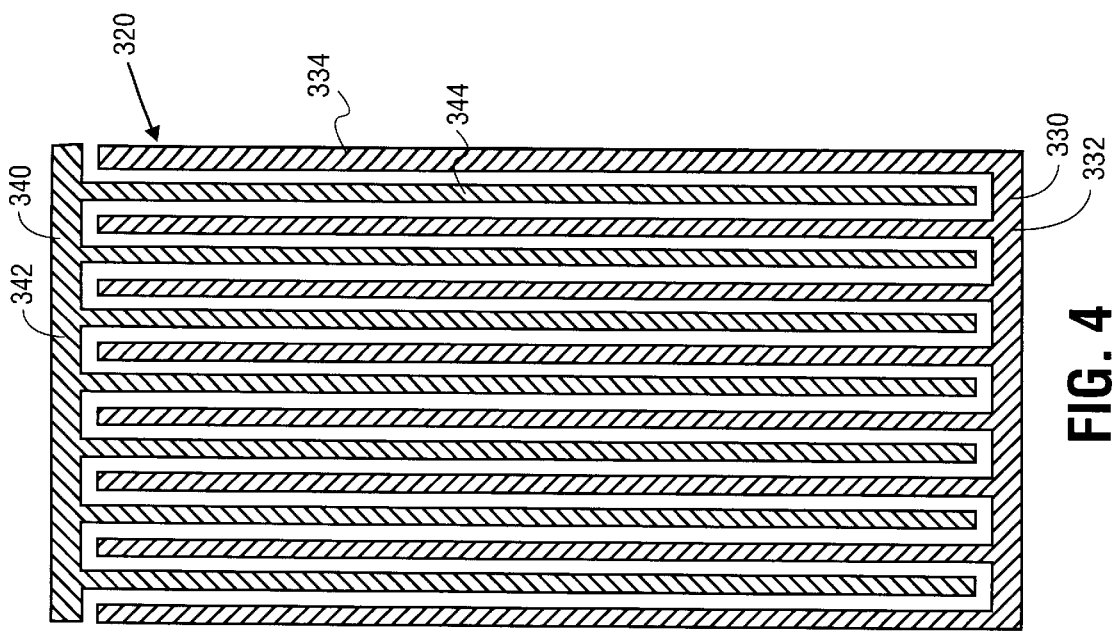
FIG. 4 is a plan view of a third capacitor element.

Additional capacitor elements can be provided in additional layers of an IC die. FIG. 4 shows an example of a third capacitor element 320 having a positive plate 330 and a negative plate 340 oriented in the similar fashion as first capacitor element 120. Positive plate 330 of third capacitor element 320 also has an end portion 332 and a plurality of fingers 334 extending perpendicular to the end portion 332. Similarly, negative plate 340 includes an end portion 342 that has a plurality of fingers 344 extending perpendicular from the end portion 342. Third capacitor element 320 has the same orientation with respect to the positive and negative plates as first capacitor element 120 because third capacitor element 320 is preferably stacked atop second capacitor element 220 of FIG. 3 in an IC die that has a third layer. Thus, as will be described in further detail below, the fingers of each plate of each respective capacitor element are oppositely charged with respect to the fingers of a capacitor element that is directly above or below in the next adjacent layer. Interlayer capacitance can be generated because of the opposite charge on the adjacent fingers of the plates in a capacitor having a plurality of capacitor elements formed in adjacent layers of an IC die.

Figure 5:
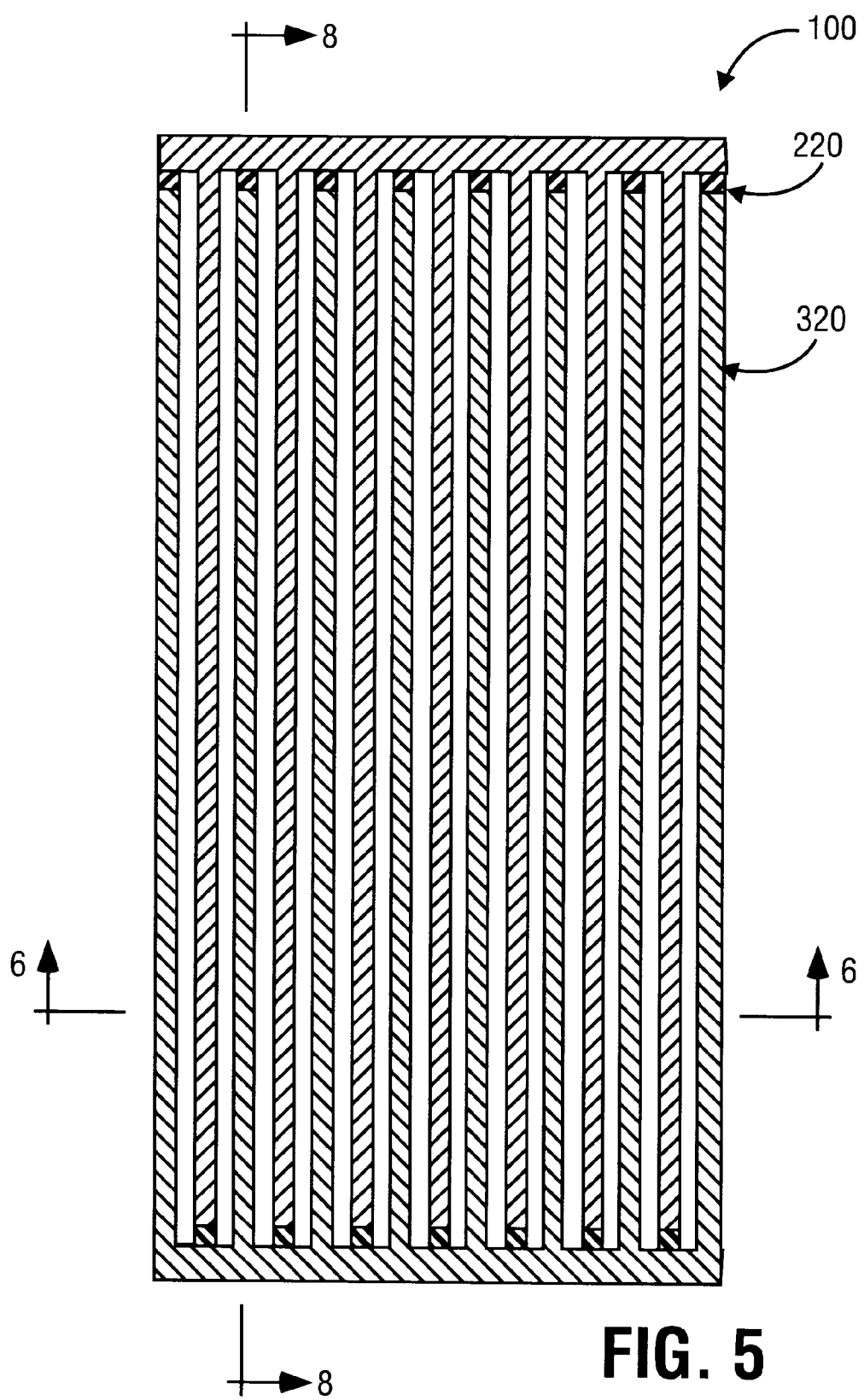
FIG. 5 is a plan view of the first, second, and third capacitor elements stacked.

FIG. 5 shows an embodiment of a capacitor 100 that includes a plurality of capacitor elements that are stacked above each other. In FIG. 5, third capacitor element 320 is stacked above second capacitor element 220 (only a portion of which is visible in the top view of the capacitor 100 shown in FIG. 5). First capacitor element 120 is directly below second capacitor element 220 but is not visible in the view shown in FIG. 5.

Capacitor 100 can include one or more capacitor elements, but preferably includes a plurality of capacitor elements that provide enough surface area between the vertical edges of adjacent fingers of each capacitor element to generate an adequate level of capacitance for any desired application. The number of layers or capacitor elements can be selected as required for a particular design.

Figure 6:
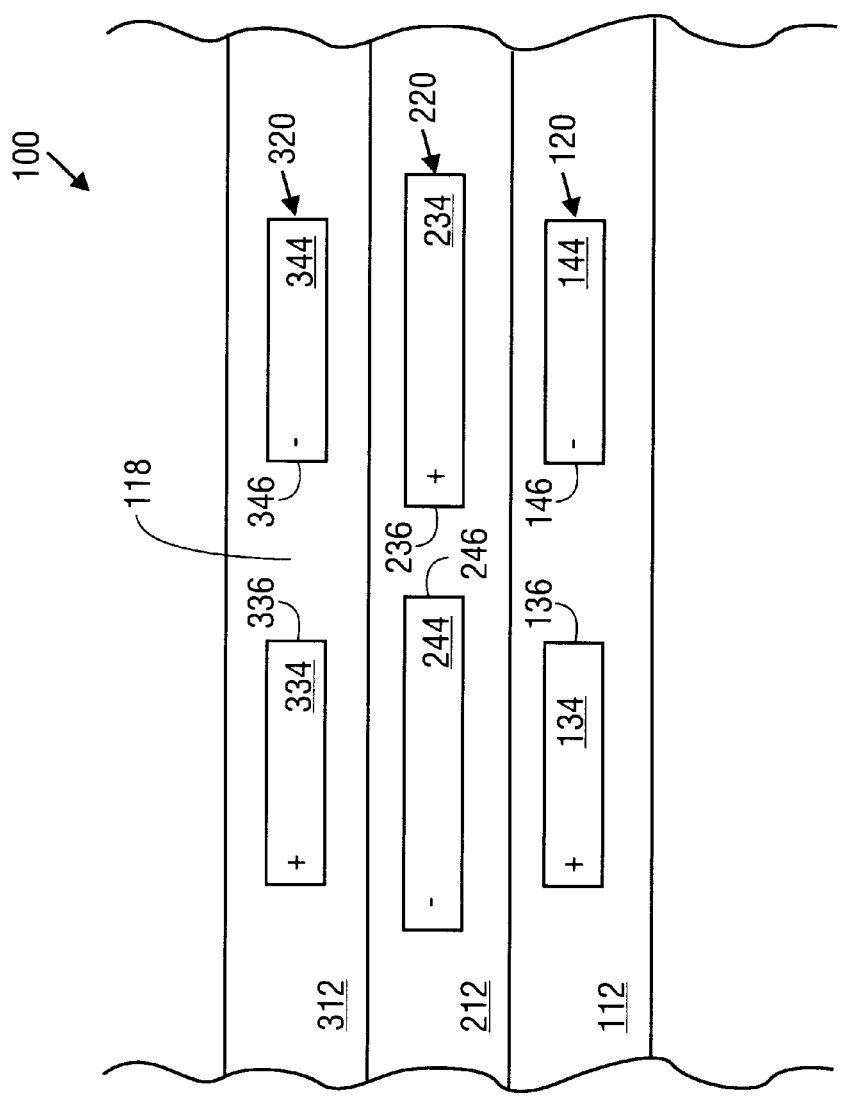
FIG. 6 is an enlarged partial cross sectional view of the capacitor taken along line 6—6 of FIG. 5.

FIG. 6 shows a cross sectional view of a portion of an IC die 110 including the capacitor 100. IC die 110 includes a plurality of layers. In the exemplary embodiment shown in FIG. 6, IC die 110 includes first layer 112, second layer 212 and third layer 312. Alternatively, IC die 110 can include more or fewer layers. The exemplary embodiment of capacitor 100 shown in FIG. 6 includes three capacitor elements formed in three adjacent layers of IC die 110. First capacitor element 120 is formed in first layer 112, second capacitor element 220 is formed in second layer 212, and third capacitor element 320 is formed in third layer 312.

FIG. 6 is a cross section showing the fingers of the three-capacitor elements. First capacitor element 120 includes positive plate fingers 134 and negative plate fingers 144. Similarly, second capacitor element 220 includes positive plate fingers 234 and negative plate fingers 244, and third capacitor element 320 includes positive plate fingers 334 and negative plate fingers 344. As shown in FIG. 6, the adjacent fingers of each respective capacitor element are separated by a dielectric 118. Dielectric 118 also separates the adjacent capacitor elements in adjacent layers of the IC die 110.

FIG. 6 shows the vertical edges 136 on the fingers 134 of the positive plate 130 of the first capacitor element 120. Likewise, vertical edges 236 and 336 are on the fingers 234 and 334 of the positive plates 230 and 330, respectively. Similarly, negative plates 140, 240, and 340 each have fingers 144, 244, and 344 with vertical edges 146, 246, and 346, respectively.

As shown in FIG. 6, the widths of the fingers can be different from layer to layer. For example, the fingers 234 and 244 of the second capacitor element 220 are wider than the fingers 134 and 144 and fingers 334 and 344 of the first and third capacitor elements. All layers could have fingers having different widths. However, this need not be the case as shown in FIG. 7 and described below.

The process used to build the fingered capacitor will provide the limitation on the minimum spacing between fingers. In the embodiment shown in FIG. 6, the layer with the narrowest spacing attainable by the process used has the widest fingers. The widths and spacings of the fingers of the various layers can be designed to achieve maximum fringe and interlayer capacitance.

Also as shown in FIG. 6, the fingers that are above and below each other are oppositely charged. Since at least a portion of the capacitor elements of each layer is at least generally aligned with that of a neighboring layer, interlayer capacitance can be generated.

Figure 7:
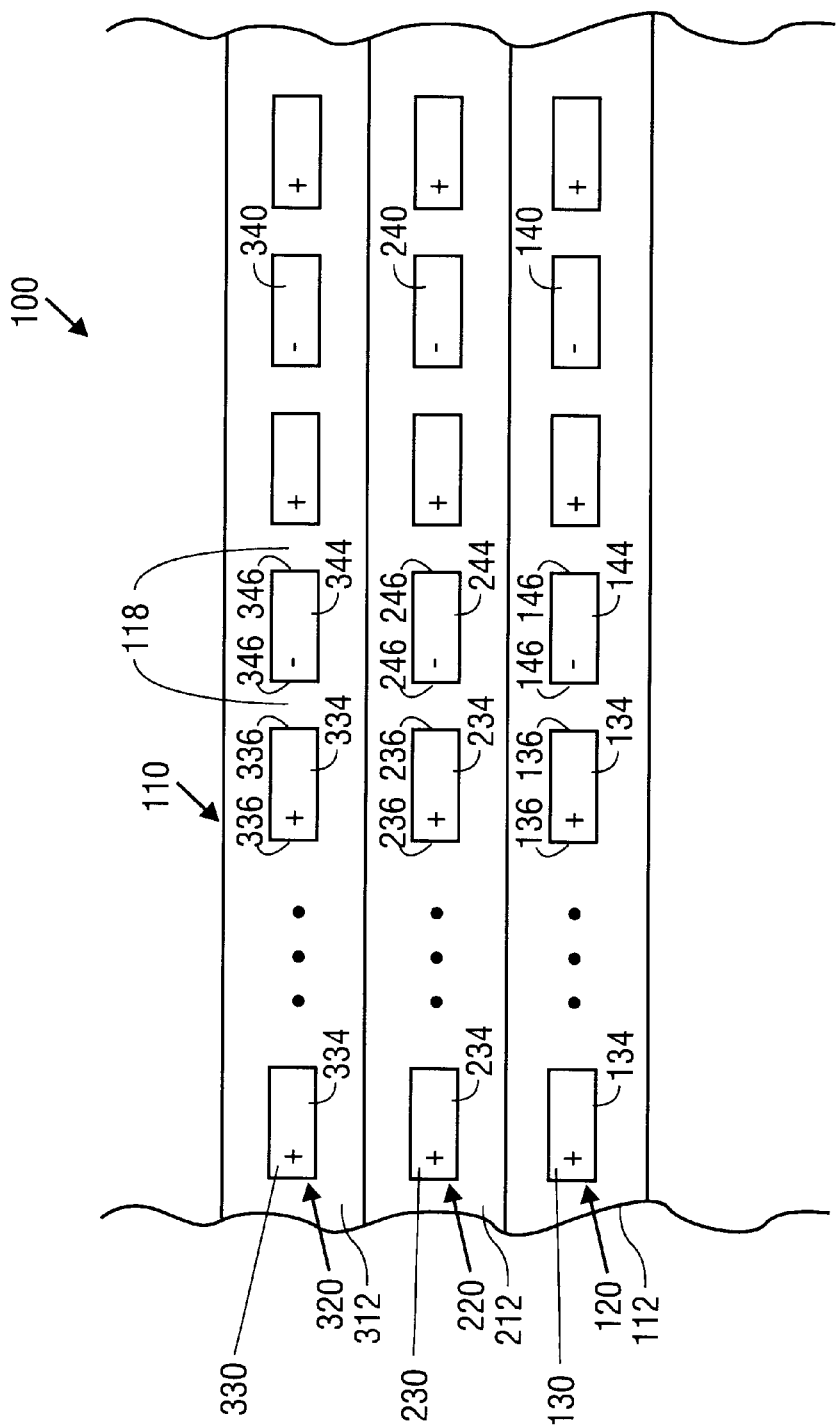
FIG. 7 is an enlarged partial cross sectional view of another embodiment of the capacitor taken along line 6—6 of FIG. 5.

FIG. 7 shows a cross sectional view of a portion of an IC die 110 including the capacitor 100. IC die 110 includes a plurality of layers. In the exemplary embodiment shown in FIG. 7, IC die 110 includes first layer 112, second layer 212 and third layer 312. Alternatively, IC die 110 can include more or fewer layers. The exemplary embodiment of capacitor 100 shown in FIG. 7 includes three capacitor elements formed in three adjacent layers of IC die 110. First capacitor element 120 is formed in first layer 112, second capacitor element 220 is formed in second layer 212, and third capacitor element 320 is formed in third layer 312.

FIG. 7 is a cross section showing the fingers of the three-capacitor elements. First capacitor element 120 includes positive plate fingers 134 and negative plate fingers 144. Similarly, second capacitor element 220 includes positive plate fingers 234 and negative plate fingers 244, and third capacitor element 320 includes positive plate fingers 334 and negative plate fingers 344.

As shown in FIG. 7, the adjacent fingers of each respective capacitor element are separated by a dielectric 118. Dielectric 118 also separates the adjacent capacitor elements in adjacent layers of the IC die 110. Dielectric 118 need not be the same type of dielectric between each layer.

In one embodiment, first layer 112 can be a polysilicon layer, commonly referred to as poly 1. The second and third layers 212 and 312 can be metal layers, which are commonly referred to as metal 1 and metal 2. The positive and negative plates including the fingers of each capacitor element can be formed using current IC manufacturing techniques. There may be more than one or two metal layers.

FIG. 7 shows the vertical edges 136 on the fingers 134 of the positive plate 130 of the first capacitor element 120. Likewise, vertical edges 236 and 336 are on the fingers 234 and 334 of the positive plates 230 and 330, respectively. Similarly, negative plates 140, 240, and 340 each have fingers 144, 244, and 344 with vertical edges 146, 246, and 346, respectively.

Figure 8:
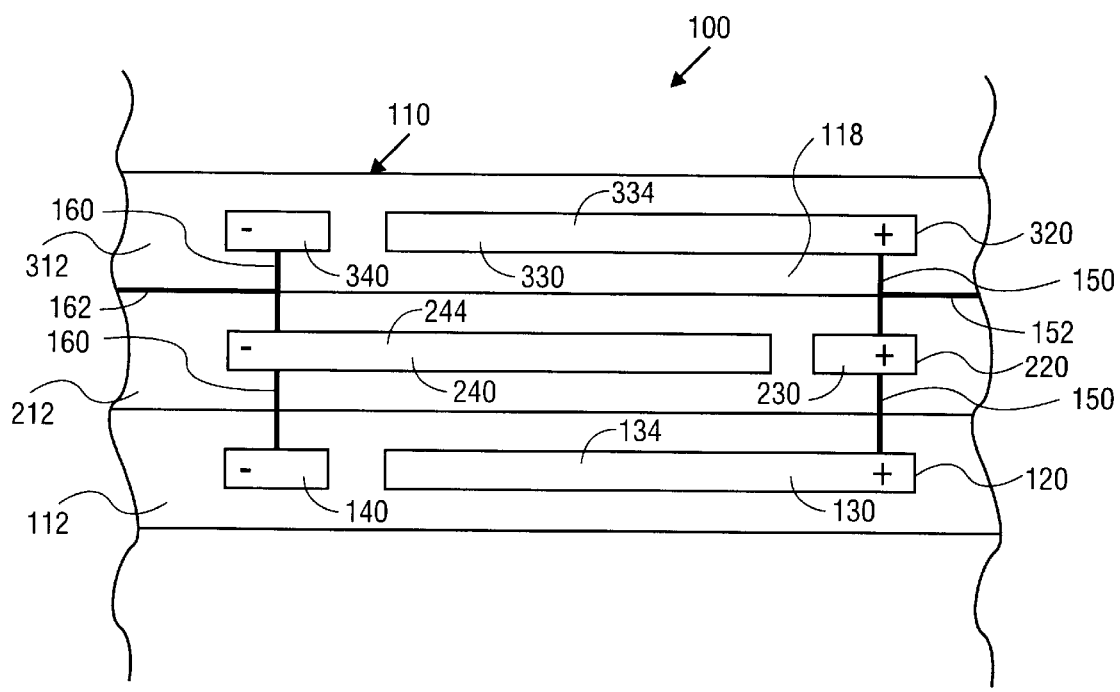
FIG. 8 is an enlarged partial cross sectional view of the capacitor taken along line 8—8 of FIG. 5.

FIG. 8 shows a cross section of a portion of an IC die 110 that includes a fingered capacitor 100. IC die 110 has three layers. First layer 112 includes first capacitor element 120, second layer 212 includes second capacitor element 220, and third layer 312 includes third capacitor element 320. Each capacitor element includes a positive plate and a negative plate. Positive plates 130, 230, and 330 are in first, second, and third layers 112, 212, and 312, respectively. Likewise, negative plates 140, 240, and 340 are in first, second, and third layers 112, 212, and 312, respectively.

The stacked capacitor elements can be interconnected to provide a single capacitor. The respective positive plates and negative plates of each capacitor element are connected by vias through the layers of the IC die 110. Positive interconnects 150 connect the positive plates 130, 230 and 330. Negative interconnects 160 connect negative plates 140, 240 and 340. While the capacitor elements of each layer are separated, they are electrically connected through vias by the interconnects.

Positive runners 152 and negative runners 162 can extend horizontally through the layers or between the dielectric 118 separating the layers. The runners are connected to a power source or signal source to provide a charge to the plates of the capacitor. The runners are the terminals of the capacitor and can extend to internal connection points or to external connection points (not shown) such as pads or leads on the IC die or package.

As discussed above, vertical interlayer capacitance is provided between portions of the positive and negative plates that are one above the other. FIG. 8 shows oppositely charged fingers 134, 244, and 334 stacked with respect to each other. Since the fingers directly above or below each other are oppositely charged, they cooperate to generate vertical interlayer capacitance.

Alternatively, any capacitor element can be horizontally shifted with respect to the capacitor element or elements in the next adjacent layer or layers such that fingers with the same charge are oriented above or below each other. In yet another embodiment, vertically adjacent capacitor elements can have their respective positive and negative plates switched such that vertical interlayer capacitance can be generated by the end portions of the plates in addition to or instead of the interlayer capacitance generated by the fingers.

When the positive and negative plates are charged, the interdigitated fingers of each capacitor element cooperate to generate lateral side-to-side fringe capacitance between the vertical edges of respectively adjacent oppositely charged fingers. The interdigitated fingers can thus generate a relatively large capacitance in a relatively small area of the IC. For a comparable value of capacitance, the capacitor elements having interdigitated fingers occupy less "real estate" in the IC compared to capacitors that are built using parallel plate capacitors. Deep sub-micron digital IC circuits can include fingered capacitors as described herein because of the relatively small space required to generate a given capacitance.

Figure 9A:
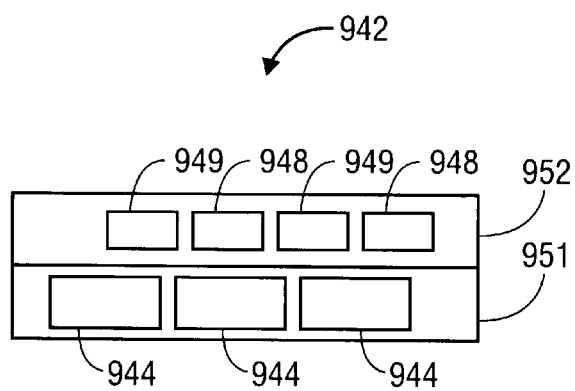
FIG. 9A shows a cross-sectional view of an IC including a random number generator circuit and a fingered capacitor element.

Since the fingered capacitor elements do not necessarily need to be formed in the silicon layer of an IC die, or in any particular layer, other devices can be formed above or below a capacitor element in adjacent layers. For example, FIG. 9A shows a cross-sectional view of an IC die 942 having a memory circuit device 944, such as in flash memory technology, the memory devices 944 can be in the bottom layer 951 and the fingered capacitor elements 948, 949, that provide the charge pump can be located directly above the memory devices 944, in the adjacent layer 952. A decreased die size in terms of length an width can thus be realized. The capacitor elements formed in the upper layers would not add thickness to the die because metal layers already exist for interconnects. In contrast, MOS transistor type gate capacitors cannot be stacked above IC devices because they are formed in the silicon layer.

Also, the net capacitance provided by the structure of the embodiments of the invention is not as dependent on the applied voltage and temperature, as is the case in capacitors formed with MOS transistors. Also, the capacitor having interdigitated fingers does not leak, as do those formed with MOS transistors with ultra thin gate oxides.

The fingered capacitor can be used wherever a linear capacitor is desired that is less dependent on voltage and temperature than gate capacitors. Relatively consistent capacitance values can be achieved with a fingered capacitor because the dielectric and spacing between fingers can be more accurately or consistently controlled. Thus, it is easier to achieve matching capacitance values when two or more capacitors are required, such as in a compensation scheme for an IC op amp to make the op amp stable. In contrast, the capacitance in a MOS capacitor can vary because of different voltages.

Figure 9B:
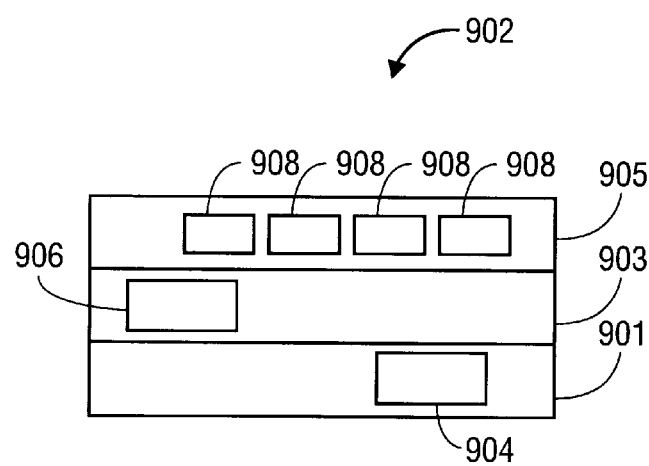
FIG. 9B shows a cross-sectional view of an IC including a memory circuit and at least one fingered capacitor element.

The capacitors having plates with interdigitated fingers can enable the integration of analog circuits in digital processes. For example, FIG. 9B shows a random number generator circuit 906 including at least one fingered capacitor element 908 can be formed in an IC die 902. Such a random number generator 906 can then be can be integrated with a microprocessor 904 on the same IC die 902. Random number generators typically require a large capacitor to hold a charge of a few picofarads or more.

Figure 9C:
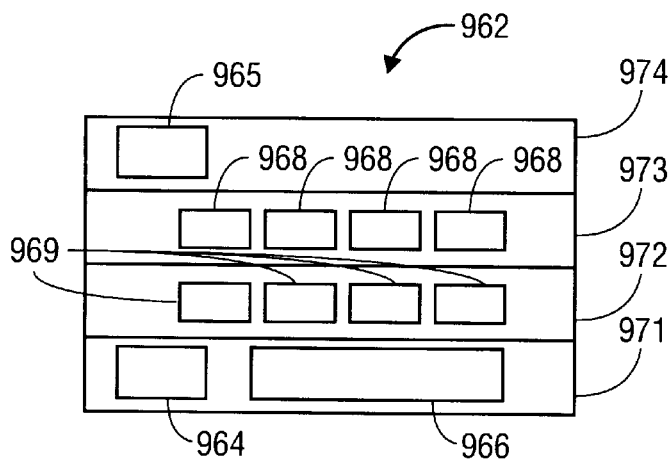
FIG. 9C shows a cross-sectional view of an IC including at least two power buses and a decoupling capacitor.

Another exemplary application is shown in FIG. 9C in which fingered capacitors can be used is to build de-coupling capacitors 968, 969 between power buses 964, 965 in an IC die 962. The decoupling capacitors 968, 969 when connected between power supply 964 (Vcc) and ground 965, decouples high frequency switching noise generated on the power supply line 964 due to the operation of the IC, such as in a microprocessor 966, for example. The decoupling capacitors 968, 969 can be built in any of the metal layers 972, 973, 974 and can be located on the die 962 wherever free space is available.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus comprising:
   a first capacitor element in a first layer of an integrated circuit (IC) die, the first capacitor element including a positive plate and a negative plate, each of the positive and negative plates of the first capacitor element having a plurality of fingers interdigitated with the fingers of the other of the positive and negative plates of the first capacitor element, the fingers being separated by a dielectric; and
   a random number generator circuit in the IC die, the random number generator circuit including the first capacitor element, wherein the random number generator is formed in a second layer adjacent to the first layer.

2. The apparatus of claim 1 wherein the interdigitated fingers cooperate to generate fringe capacitance between neighboring fingers.

3. The apparatus of claim 1 further comprising a second capacitor element in a second layer adjacent the first layer, the second capacitor element including a positive plate and a negative plate, each of the positive and negative plates of the second capacitor element having a plurality of fingers interdigitated with the fingers of the other of the positive and negative plates of the second capacitor element, the fingers being separated by a dielectric, the second capacitor element being separated from the first capacitor element by the dielectric.

4. The apparatus of claim 3 wherein the interdigitated fingers of each capacitor element cooperate to generate fringe capacitance between neighboring fingers.

5. The apparatus of claim 3 wherein a portion of the positive plate of the first capacitor element is substantially aligned with a respective portion of the negative plate of the second capacitor element, and a portion of the negative plate of the first capacitor element is substantially aligned with a respective portion of the positive plate of the second capacitor element, and the first and second capacitor elements cooperate to generate interlayer capacitance between the substantially aligned portions.

6. The apparatus of claim 1 further comprising a microprocessor on the IC die.

7. An apparatus comprising:
   an integrated circuit (IC) die including a microprocessor;
   a capacitor including a first capacitor element in a first layer of the IC die, the first capacitor element including a positive plate and a negative plate, each of the positive and negative plates of the first capacitor element having a plurality of fingers interdigitated with the fingers of the other of the positive and negative plates of the first capacitor element, the fingers being separated by a dielectric; and
   a random number generator circuit in the IC die, the random number generator circuit including the capacitor, wherein the random number generator is formed in a second layer adjacent to the first layer.

8. The apparatus of claim 7 wherein the capacitor includes a second capacitor element in a second layer adjacent the first layer, the second capacitor element including a positive plate and a negative plate, each of the positive and negative plates of the second capacitor element having a plurality of fingers interdigitated with the fingers of the other of the positive and negative plates of the second capacitor element, the fingers being separated by a dielectric, the second capacitor element being separated from the first capacitor element by the dielectric.

9. The apparatus of claim 8 wherein the interdigitated fingers of each capacitor element cooperate to generate fringe capacitance between neighboring fingers.

10. The apparatus of claim 9 wherein a portion of the positive plate of the first capacitor element is substantially aligned with a respective portion of the negative plate of the second capacitor element, and a portion of the negative plate of the first capacitor element is substantially aligned with a respective portion of the positive plate of the second capacitor element, and the first and second capacitor elements cooperate to generate interlayer capacitance between the substantially aligned portions.

11. An apparatus comprising:
    an integrated circuit (IC) including a plurality of power buses;
    a decoupling capacitor between at least two of the plurality of power buses, the decoupling capacitor including a first capacitor element in a first layer of an integrated circuit (IC) die, the first capacitor element including a positive plate and a negative plate, each of the positive and negative plates of the first capacitor element having a plurality of fingers interdigitated with the fingers of the other of the positive and negative plates of the first capacitor element, the fingers being separated by a dielectric wherein at least one of the plurality of power buses is formed in a second layer.

12. The apparatus of claim 11 further comprising a second capacitor element in a second layer adjacent the first layer, the second capacitor element including a positive plate and a negative plate, each of the positive and negative plates of the second capacitor element having a plurality of fingers interdigitated with the fingers of the other of the positive and negative plates of the second capacitor element, the fingers being separated by a dielectric, the second capacitor element being separated from the first capacitor element by the dielectric.

13. The apparatus of claim 12 wherein the interdigitated fingers of each capacitor element cooperate to generate fringe capacitance between neighboring fingers of each capacitor element.

14. The apparatus of claim 12 wherein a portion of the positive plate of the first capacitor element is substantially aligned with a respective portion of the negative plate of the second capacitor element, and a portion of the negative plate of the first capacitor element is substantially aligned with a respective portion of the positive plate of the second capacitor element.

15. The apparatus of claim 14 wherein the first and second capacitor elements cooperate to generate interlayer capacitance.

16. An apparatus comprising:
    an integrated circuit (IC) die including a memory circuit;
    a first capacitor element in a first layer of the IC die, the first capacitor element including a positive plate and a negative plate, each of the positive and negative plates of the first capacitor element having a plurality of fingers interdigitated with the fingers of the other of the positive and negative plates of the first capacitor element, the fingers being separated by a dielectric wherein the memory circuit is formed in a second layer.

17. The apparatus of claim 16 further comprising a second capacitor element in a second layer adjacent the first layer, the second capacitor element including a positive plate and a negative plate, each of the positive and negative plates of the second capacitor element having a plurality of fingers interdigitated with the fingers of the other of the positive and negative plates of the second capacitor element, the fingers being separated by a dielectric, the second capacitor element being separated from the first capacitor element by the dielectric.

18. The apparatus of claim 17 wherein the interdigitated fingers of each capacitor element cooperate to generate fringe capacitance between neighboring fingers of each capacitor element.

19. The apparatus of claim 17 wherein a portion of the positive plate of the first capacitor element is substantially aligned with a respective portion of the negative plate of the second capacitor element, and a portion of the negative plate of the first capacitor element is substantially aligned with a respective portion of the positive plate of the second capacitor element.

20. The apparatus of claim 19 wherein the first and second capacitor elements cooperate to generate interlayer capacitance.

21. The apparatus of claim 16, wherein the first capacitor element in the first layer substantially overlaps the memory circuit in the second layer.

* * * * *